United States Patent [19]
Kano et al.

[11] Patent Number: 4,816,878
[45] Date of Patent: Mar. 28, 1989

[54] NEGATIVE RESISTANCE SEMICONDUCTOR DEVICE

[75] Inventors: Hiroyuki Kano, Aichi; Masafumi Hashimoto; Nobuhiko Sawaki, both of Nagoya, all of Japan

[73] Assignee: Kabushiki Kaisha Toyota Chuo Kenkyusho, Aichi, Japan

[21] Appl. No.: 929,783

[22] Filed: Nov. 13, 1986

[30] Foreign Application Priority Data

Nov. 14, 1985 [JP] Japan .................. 60-255540

[51] Int. Cl.$^4$ .................. H01L 27/12; H01L 29/161
[52] U.S. Cl. .................. 357/4; 357/16
[58] Field of Search .................. 357/4 SL, 4, 16

[56] References Cited

U.S. PATENT DOCUMENTS

| | | | |
|---|---|---|---|
| 4,163,237 | 7/1979 | Dingle et al. | 357/16 |
| 4,257,055 | 3/1981 | Hess et al. | 357/57 |
| 4,620,206 | 10/1986 | Ohta et al. | 357/16 |
| 4,665,412 | 5/1987 | Ohkawa et al. | 357/4 |
| 4,720,309 | 1/1988 | Deveand et al. | 357/16 |
| 4,745,452 | 5/1988 | Sollner | 357/16 |

OTHER PUBLICATIONS

"Negative Differential Resistance at 300 K in a Superlattice Quantum State Transfer Device", Applied Physics Letters, vol. 44, No. 11, p. 1054, 1984.
Summers et al, "Variably Spaced Superlattice Energy Filter, a New Device Design Concept for High-Energy Electron Injection", pp. 806-808, Applied Physics Letters, 48(12), Mar. 1986.

Primary Examiner—J. Carroll
Assistant Examiner—Ngan V. Ngo
Attorney, Agent, or Firm—Parkhurst, Oliff & Berridge

[57] ABSTRACT

A semiconductor device having a superlattice structure, which comprises at least one unit structure including first and third semiconductor layers as quantum well layers, and a second semiconductor layer as a barrier layer, which are arranged alternately on each other is described. The first semiconductor layer has a higher impurity concentration than the third semiconductor layer and has a quantum energy level determined by its thickness. The third semiconductor layer is of a thickness having quantum energy levels, one of which is lower than that of the first semiconductor layer and the second of which is equal to or higher than that of the first semiconductor layer. The second semiconductor layer is of a thickness which allows electrons existing at the second quantum energy level of the third semiconductor layer to transfer easily from the third to the first semiconductor layer. An increase in voltage applied to the semiconductor device causes electrons to transfer to the first semiconductor layer through the second quantum energy level of the third semiconductor layer to reduce the mobility of electrons in the first semiconductor layer, thus causing the semiconductor device to develop a negative resistance.

7 Claims, 10 Drawing Sheets

Microfiche Appendix Included
(048166045 Microfiche, Carroll; J. Pages)

NEGATIVE RESISTANCE SEMICONDUCTOR DEVICE

BACKGROUND OF THE INVENTION

1. Field of the Invention

The present invention relates to a semiconductor device, and in particular, to a semiconductor device developing a negative resistance and having a superlattice structure.

2. Description of the Prior Art

Recently, there have been proposed high frequency devices having a superlattice structure according to various structures and principles. Among these devices is a device developing a negative resistance, namely, a negative resistance device capable of effecting an oscillation in a high frequency which exceeds the frequencies of the conventional devices. There has been recently proposed a negative resistance device using a real space transition in a superlattice structure formed by use of a heterojunction of GaAs/Al$_x$Ga$_{(1-x)}$As configuration (Applied Physics Letters, Vol. 44, No. 11, p. 1054, 1984). FIG. 11 shows a cross-sectional configuration of an example of such a device. Namely, the configuration includes an undoped GaAs buffer layer 12, an n-type Al$_{0.36}$Ga$_{0.64}$As layer 13, a superlattice layer 14, an n-type Al$_{0.36}$Ga$_{0.64}$As layer 13, an n$_+$-type GaAs layer 15a–15b for contact, and two ohmic electrodes 16a–16b formed respectively over a half insulated GaAs substrate 11. As a phenomenon of this device, a negative resistance appears when voltages applied to the electrodes 16a–16b are increased. In this structure, the superlattice layer 14 is the most important portion to develop the negative resistance effect. This layer 14 has a structure in which a plurality of unit structures 140 of the superlattice layer as shown in FIG. 12 alternately lie on each other. The unit structure of the superlattice layer 14 comprises an 80 Å thick doped Al$_{0.3}$Ga$_{0.7}$As barrier layer 141, and 80 Å thick GaAs layer forming a first quantum well layer 142, and an 80 Å thick Al$_{0.06}$Ga$_{0.94}$As layer forming a second quantum well layer 143. Here, the first and second quantum well layers 142 and 143 each have the same impurity concentration, Si-doped $10^{15}$cm$^{-3}$.

FIG. 13 shows an energy band diagram of the conduction band in the unit structure of the superlattice. The operation mechanism of the device will be described below. In this structure, two kinds of quantum well layers 22 and 23 having different properties with respect to the conduction electrons (corresponding to the reference numerals 142 and 143 of FIG. 12, respectively) are alternately formed with a barrier layer 21 (corresponding to the reference numeral 141 of FIG. 12) therebetween. Where the thickness of the barrier layer 21 is about 80 Å which allows electrons to pass therethrough. Here, the quantum well layers 22 and 23 each are sandwiched between two barrier layers 21. When the conduction band in the quantum well layer is quantized, the ground state of electrons in the quantum well layer 22 is set to, for example, energy level 221 and the ground state of electrons in the quantum well layer 23 is set to energy level 231. Since the energy level 221 is lower than the energy level 231, the conduction electrons are substantially at the energy level 221 in the equilibrium state and hence conduction is dominated by the electron mobility in the quantum well layer 22. However, when the energy of an electron accelerated in an electric field generated by an increasing voltage exceeds the energy difference between the energy levels 221 and 231, tunnel effect takes place as indicated by an arrow in FIG. 13, and hence electrons are allowed to pass through the barrier layer 21 and to move from the quantum well layer 22 to the quantum well layer 23.

On the other hand, as can be seen from the relationships between the electron mobility and the AlAs mol fraction in the Al$_x$Ga(1−x). As of FIG. 14, the electron mobility in the GaAs is more than that in the Al$_{0.06}$Ga$_{0.94}$As. Consequently, when the composition of the quantum well layer 23 is set to Al$_{0.06}$Ga$_{0.94}$As, the mobility of the electrons transferred to and situated in the quantum well layer 23 by virtue of the tunnel effect is apparently lowered. The result is that a negative resistance, as shown in FIG. 15, is developed.

Conventional negative resistance devices are attended with various problems. In the conventional example, when the thickness of the quantum well layer is about 80 Å, the energy state of the electrons in the well layer is quantized. This is called a quantum well. When the tunnel effect is desired to be used between quantum levels of the different quantum wells, the content of Al (mol fraction of Al As) in the quantum well and the layer thickness must be precisely controlled as parameters to determine the quantum level of each quantum well. In a crystal growth method (for example, the molecular beam epitaxial growth method, MBE) for obtaining the superlattice structure, the control of the crystal composition (the mol fraction of Al As in this case) is more difficult than the control of the thickness. The thickness can be controlled to the level of a single-atom layer. However, fine control of the crystal composition cannot be easily implemented. Moreover, in the conventional example, crystal growth utilizes a crystal having two different kinds of aluminum compositions. To achieve a precise control of the two kinds of aluminum compositions, two aluminum cells are required in the MBE method. However, the use of two aluminum cells leads to a loss of controllability.

In addition, it is clearly favorable with respect to the performance of the device in the conventional example from a point of view of the operation principle that a greater difference exists between the electron mobility of the quantum well layer 22 and the electron mobility of the quantum well layer 23 of the FIG. 13. For example, in a report of the conventional example, the difference between the electron mobility of GaAs and Al$_{0.06}$Ga$_{0.94}$As is used. However, as can be seen from the conventionally reported data of FIG. 14, a great difference cannot be expected. Moreover, to obtain a great value of the difference between the electron mobilities, the relative amount of aluminum in the quantum well layer must be increased. In addition, as the relative amount of aluminum in the quantum well layer is increased, it is necessary to increase also the relative amount of aluminum in the barrier layer. However, in the general Al$_x$Ga$_{(1-x)}$As, as the amount (x) of aluminum increases, the amount of impurity atoms having deeper energy levels increases and hence the crystallizability of the device is decreased. On the other hand, when the amount (x) of aluminum in the barrier layer becomes greater, the heterojunction boundary of the GaAs quantum well layer not containing aluminum is deteriorated.

Consequently, the electron mobility in the quantum well layer 22 is lowered and hence a decrease of the operation speed of the device and the like may possibly be caused. This decrease leads to problems associated with the manufacturing of the devices and with their performance.

Moreover, in the conventional example, only the lowest levels 221 and 231 are considered for the potential energy of the quantum levels formed in the quantum well layers 22 and 23, respectively. In general, a plurality of quantum levels having the higher energy exist in the quantum well layer.

For a semiconductor device using a transition process of electrons between the quantum well layers 22 and 23, applied as a high frequency device (up to 100 GHz), such as when the limit of the frequency in the transition process is to be considered, the determination of the structure with consideration to such quantum levels is essential. The consideration of the quantum levels is missing in the conventional example.

SUMMARY OF THE INVENTION

It is, therefore, an object of the present invention to provide a semiconductor device which develops a negative resistance, which includes a superlattice structure which has the higher performance, and which can be more easily manufactured than the conventional device, thereby removing the problems of the prior art technology.

According to the present invention there is provided a semiconductor device having a superlattice structure, which is comprised of at least one unit structure comprising first and third semiconductor layers as quantum well layers, and a second semiconductor layer as a barrier layer having a forbidden energy band gap of which the width is greater than the width of the forbidden energy band of the quantum well layers. The quantum well layers are alternately arranged with the barrier layer to form the superlattice unit structure.

The first semiconductor layer has a higher impurity concentration than the third semiconductor layer and has a quantum energy level determined by the layer thickness thereof. The third semiconductor layer is of a thickness having two quantum energy levels. The first quantum energy level is lower than that in the first semiconductor layer and the second quantum energy level is equal to or higher than that in the first semiconductor layer.

The second semiconductor layer is of a thickness which allows electrons existing at the second quantum energy level of the third semiconductor layer to transfer easily from the second quantum energy level of said first semiconductor layer. The thickness of the quantum well layer and that of the barrier layer are less than or equal to the de Broglie wavelength.

With an increase in voltage applied to the semiconductor device, electrons at the first quantum energy level of the third semiconductor layer are allowed to transfer to the quantum energy level of the first semiconductor layer through the other quantum energy level of the third semiconductor layer to reduce the mobility of electrons in the first semiconductor layer having a negative resistance.

In a superlattice of the structure described above, one of two quantum well layers having the smaller thickness has the ground state of quantum level with the higher potential energy in the conduction band. Consequently, when the applied voltage is low, conduction is dominated through a first quantum well layer, where the electron mobility is great because the impurity concentration is low. However, when the applied voltage is increased and the electrons in the first quantum well layer are accelerated to obtain the excitation energy and are thus passed through the barrier layer by virtue of the tunnel effect to enter a second quantum well layer, then the electron mobility becomes smaller because the impurity concentration is high in the second quantum well layer. Consequently, the electron mobility is apparently lowered as the applied voltage is increased. This reduced mobility is observed as a negative resistance.

Next, a description will be given of the basic structure and operation principle of the semiconductor device according to the present invention.

FIG. 5 shows a unit structure 40 of the superlattice which develops the negative resistance of the semiconductor device according to the present invention. This structure includes a semiconductor layer 41 (for example, of $Al_{0.3}Ga_{0.7}As$) forming a barrier layer of the quantum well and semiconductor layers 42-43 (for example, of GaAs) forming quantum well layers each having a forbidden energy band gap which is less than that of the barrier layer. Moreover, the impurity concentration (for example, of a Si-donor) of the quantum well layer 42 is greater than that of the barrier layer 41. Thicknesses $d_{41}$, $d_{42}$ and $d_{43}$ of the semiconductor layers 41, 42 and 43, respectively, are equal to or less than the de Broglie's wavelength of electrons, and $d_{43} > d_{42}$ holds.

FIG. 6 is a band diagram of the conduction band of the unit structure of the superlattice. When the thickness $d_{41}$, $d_{42}$ and $d_{43}$ become equal to or less than the de Broglie's wavelength of electrons, the energy state allowed for the electrons in the conduction band of the quantum well is quantized and hence the ground levels 421-431 and first excitation energy levels 422-432 are respectively formed in the quantum layers 42 and 43. When a voltage is applied between electrodes 44a and 44b of Fig. 5 to accelerate electrons in a direction (indicated by an arrow A in FIG. 5) perpendicular to the direction of thickness of the superlattice, electrons at the level 431 in the quantum well layer 43 are excited to the level 432 by the electric field as the voltage is increased (indicated by an arrow 8 in FIG. 6). The levels 432 and 421 are in the neighborhood of each other with respect to energy and hence a resonance takes place therebetween, which increases the probability that the electrons pass through the layer 41 (indicated by an arrow C in FIG. 6). The electrons thus having passed through the barrier layer are scattered by impurity atoms in the quantum well layer 42. Scattering of the electrons by impurity atoms lowers the electron mobility.

FIG. 7 shows an example of the change of electron mobility with respect to GaAs when the impurity concentration is altered. For example, the electron mobility of about 7000 $cm^2/v.s$ for the impurity concentration on the order of $10^{15}$ $cm^{-3}$ is reduced to at most half the original value, which is about 3000 $cm^2/v.s$ for the impurity concentration of $10^{18} cm^{-3}$. That is, in the range where the applied voltage is low in FIG. 6, conduction is dominated by electrons in the quantum well layer 43 in which the impurity concentration is low and the electron mobility is high. When the voltage is increased, the conduction of electrons is dominated through the quantum well layer 42 in which the impurity concentration is high and the electron mobility is low. Consequently, the electrons running at the high electron mobility at the low voltage apparently seem to be shifted in the state of the low electron mobility at the high voltage applied and enhancing the tunnel transition effect. Also in the superlattice device of the present invention, the negative resistance of the conventional example as shown in FIG. 15 can be similarly developed.

FIG. 5 shows a unit structure or a unit period of superlattice. The superlattice structure basically needs only one period. However, to increase the intensity of the signal (current) to be externally obtained, a plurality of periods are preferably provided.

In addition, to increase the amplitude of current variation (peak-to-valley ratio) in the current-voltage characteristic of a device having a negative resistance, two or more quantum well layers 42 having a low electron mobility are disposed as destinations for electrons, thereby increasing the number of states of the electron destinations. In this case, the narrow quantum well layer 42 to be increased is basically of the same composition as the quantum well layer 42, namely, of a structure in which a barrier layer having the same composition as the barrier layer 41 is sandwiched between two quantum well layers 42.

Although the device described above comprises components only configured in the basic superlattice structure, it is natural when configuring a device that a substrate semiconductor for growing a superlattice and a semiconductor layer for facilitating a reduction of the resistance of the ohmic electrode are added to the superlattice.

The unit structure 40 of the superlattice shown in FIG. 5 includes a barrier layer 41 (for example, $Al_xGa_{(1-x)}As$) and two kinds of quantum well layers 42 and 43 (for example, GaAs) having the different layer thicknesses.

The thickness $D_{41}$ of the barrier layer need be small enough to enable the electrons to tunnel between the quantum wells. However, there is also required a thickness that allows the formation of an independent quantum level in the quantum well. Namely, the thickness is desirably set to be in a range of 30 Å $< d_{41} <$ 100 Å.

For the thickness of the two kinds of quantum well layers, assume that the greater thickness is $d_{43}$ and the smaller thickness is $d_{42}$, then the following relationships are desirably held: $d_{43} > d_{42}$, 50 Å $< d_{43} <$ 250 Å, and 30 Å $< d_{42}$. Moreover, by determining $d_{43}$, the optimum value of $d_{42}$ is automatically determined from the relationships of FIG. 8 to be described later.

On the other hand, for the doping concentration of impurity atoms in the layers 41 and 43 of FIG. 6, the layer 41 is intentionally not doped (undoped) or is an n-type layer with a low impurity concentration, the layer 43 is undoped or of a low impurity concentration (for example, $10^{15} cm^{-3}$ or less), and the layer 42 is doped to have a high impurity concentration (for example, from $5 \times 10^{17}$ to $2 \times 10^{18} cm^{-3}$ of Si).

Referring now to FIGS. 6-7, a description will be given of the operation associated with the negative resistance in the superlattice according to the present invention. The superlattice structure comprises, for example, GaAs layers 42 and 43 and an $Al_xGa_{(1-x)}As$ layer 41 in FIG. 6. In this diagram, conduction band structure of each layer is schematically illustrated. As can be seen from this conduction band diagram, reference numeral 41 indicates a potential barrier layer and reference numerals 42 and 43 denote quantum well layers. The thicknesses $d_{42}$ and $d_{43}$ of the quantum well layers 42 and 43 are required to satisfy the relationship of $d_{42} < d_{43}$. The design conditions of the thicknesses of these two quantum well layers will be described later. For example, Si atoms are doped as donor in the quantum well layer 42. Assuming the electron mobilities of the layers 42 and 43 to be $\mu_{42}$ and $\mu_{43}$, respectively, the relationship of $\mu_{43} > \mu_{42}$ holds as can be seen from FIG. 7.

That is, in the stationary state, the electrons exist at the ground level 431 of the quantum well layer 43 among the quantum levels established in the quantum well layers 42 and 43. In this state, the electron mobility is set to $\mu_{43}$. Next, when the electrons are accelerated, for example, due to an externally applied voltage and the energy becomes equal to or more than the potential energy difference between the energy level 431 and the first excitation energy level 432, the electrons pass the barrier layer 41 in a direction indicated by C in FIG. 6 and the energy state is changed to the ground energy level 421 of the layer 42. Here, the electron mobility is set to $\mu_{42}$. Due to the applied voltage as described above, the electrons are subjected to a real space transition and hence a decrease of the electron concentration takes place, which enables to obtain the negative resistance.

Next, based on the operation principle, a detailed description will be given of the design of the superlattice structure in the semiconductor device according to the present invention. First, as for the height of the barrier layer, although the design parameter values to be described in the following paragraphs are slightly changed depending on the barrier height Ec, the method and the relational expressions used to determine the parameters need not be changed. Here, the commonly used $Al_{0.3}Ga_{0.7}As$ is also adopted as the barrier layer. On this condition, $\Delta Ec \approx 0.3$ eV results.

First, for the quantum levels important in the transition processes indicated by the arrows B and C in FIG. 6, the design procedure will be described. Assume that the barrier layer has a sufficiently great thickness, then the quantum level depends on the layer thickness $d_\omega$ of the quantum well layer and the energy difference $\Delta Ec$ relative to the bottom of the conduction band of the well is expressed as follows.

$$\Delta Ec \approx (h^2/2m^*)(\pi \cdot n/d_\omega)^2$$

where, m* indicates the effective mass of an electron, n is an integer (1, 2, 3, etc.), and h denotes the Planck's constant. FIG. 8 shows the relationships between the $E_1$, $E_2$ and $d_\omega$.

Design procedures of the thicknesses $d_{42}$ and $d_{43}$ of the quantum well layers will be described with reference to FIG. 8. First, $d_{43}$ is obtained and then $d_{42}$ is determined. As for $d_{43}$, if the excitation with respect to the quantum level between the ground level and the first excitation level is caused at the room temperature, a troublesome noise is generated. To overcome this difficulty, the value of $d_{43}$ is preferably set as $d_{43}$ 250 Å to set the difference therebeween to a value at least equal to the thermal noise energy 0.026 eV at the room temperature (the region on the left side of the line D in FIG. 8). The minimum width will be discussed later together with the thickness of the barrier layer.

Next, the procedure for obtaining $d_{42}$ will be described on the assumption of $d_{43} = 150$ Å. On this condition, the first excitation level is determined from FIG. 8 and thus $\Delta E = 0.1$ eV is determined as indicated by an arrow E in the diagram. Consequently, the thickness of the quantum well layer enabling to obtain such a value of ΔE at the ground level is determined to be about 70 Å by use of the arrow E in FIG. 8.

Next, the thickness $d_{41}$ of the barrier layer 41 will be described. This layer serves to establish the quantum well for the formation of a quantum level and to move electrons from the layer 43 to the layer 42 by virtue of the tunnel effect. For the formation of the quantum level, $d_{41}$ is preferably set to a great value; whereas, for the tunnel effect, $d_{41}$ is desired to be small.

First, conditions for the electron transition associated with the tunnel effect will be described. For simplicity, assume $\Delta E_c = 0.3$ eV and a potential box of which the width is $d_B$ as shown in FIG. 9, then the probability $T_t$ of electrons to pass (tunnel) therethrough is obtained as follows:

$$T_t \simeq \exp\left(-2\sqrt{\frac{M^* \Delta E_c}{h^2}} \, d_B\right)$$

The results of this calculation are plotted in the graph of FIG. 9, which shows that the tunnel probability is abruptly lowered as $d_B$ increases. Namely, for $d_B > 50$ Å, the probability is at most 1%. However, this evaluation is made on the assumption that a free space exists on both sides of the barrier. Actually, there exist quantum levels and the transition energy levels are similar to each other. This causes a strong coupling and hence raises the transition probability. Actually, however, $d_B < 100$ Å is preferable.

Next, a description will be given of the determination of the allowable minimum thickness of the barrier 41 and the minimum thickness of the quantum well layer 42. Assume that the quantum well layers and the barrier layers alternately overlap each other. If so, then the quantum levels established in the quantum wells are not identical to the simply discrete levels as shown in FIG. 8. The effect of the multiple reflection between the potential barriers becomes significant and hence minibands are established. FIG. 10 shows an example of a case where minibands are formed. This graph reflects the results of a numerical calculation. In this example, $\Delta E_c = 0.4$ eV and the quantum well layer and the barrier layer have the same thickness a. According to the calculation, for $a \simeq 30$ Å, the miniband at the ground level must have a width at least equal to the thermal energy 0.026 eV at 300° K. Similarly, it can be seen that the corresponding condition is $a \simeq 50$ Å for the first excitation level. Under these conditions, the lower limit of thicknesses of the quantum well layer 42 and the barrier layer 41 are estimated to be:

$d_{42}, d_{41} > 30$ Å.

Finally, a description will be given of the utilization of the Si donor scattering to implement $\mu_{43} > \mu_{42}$. Before discussion the electron mobility, the procedure for supplying conduction electrons to the superlattice structure will be first described. In the conventional example, as shown in FIG. 11, Si atoms are doped uniformly in the entire superlattice structure to obtain the impurity concentration of $10^{15}$ (atoms) cm$^{-3}$ and Si atoms are further doped in the $Al_{0.36}Ga_{0.64}As$ layers 13 on both sides of the superlattice structure to obtain the impurity concentration of $10^{17}$cm$^{-3}$, thereby supplying conduction electrons to the superlattice structure. In contrast, according to the structure of the present invention, the conduction electrons are supplied from the impurity atoms (for example, Si atoms) doped in the quantum well layer 42 having the superlattice structure as shown in FIG. 5, namely, the impurity doping in the quantum well layer 42 simultaneously serves two functions to supply the conduction electrons and to lower the electron mobility $\mu_{42}$ in the layer 42.

First, as for the change of mobility due to the difference in the impurity concentration at a low temperature such as 77° K., the phonon interaction of electrons becomes weak and the electron scattering mechanism is considered to be mainly determined by the doped impurity (for example, the Si donor). That is, $$\mu = \left(\frac{1}{\mu_l} + \frac{1}{\mu_i}\right)^{-1} \simeq \mu_i \simeq (M^*)^{-1/2} N_D^{-1} T^{3/2}$$

where, $\mu_l$ and $\mu_i$ represent the electron mobilities determined by the phonon scattering and impurity scattering, m* is the effective mass of electron, $N_D$ denotes the donor density, and T is the temperature.

If the temperature T is assumed to be constant, the electron mobility changes according to the inversely proportional relationship with respect to the impurity donor density $N_D$, and hence if the donor densities of the layers 42 and 43 are set to $N_{D42}$ and $N_{D43}$, respectively, the following expression is obtained.

$$\frac{\mu_{42}}{\mu_{43}} \simeq \frac{N_{D43}}{N_{D42}}$$

When manufacturing the structure of the semiconductor device of the present invention by use of the molecular beam epitaxial method, $N_{D43} \simeq 10^{14}$cm$^{-3}$ is obtained as the background for the GaAs layer in which the impurity substance is not doped. As an example, if the Si doping amount for the layer 42 is $10^{18}$cm$^{-3}$, $$\frac{\mu_{42}}{\mu_{43}} = \frac{10^{14}}{10^{18}} = 10^{-4}$$

results. Actually, however, since there exists phonon scattering due to the periodicity of the quantum well structure, such great difference cannot be considered to be developed. It seems to be possible to obtain the difference greater than the mobility difference (as indicated in FIG. 14) at least caused by the difference of the Al/As mol fraction.

The change of the electron mobility at the room temperature will be obtained as follows from FIG. 7 in a case where $10^{15}$cm$^{-3}$ of Si atoms are doped in the GaAs layer 43 and $10^{18}$cm$^{-3}$ of Si atoms are doped in the layer 42.

$$\frac{\mu_{42}}{\mu_{43}} \simeq 2.3$$

It can be seen from FIG. 7 that the apparent difference of the electron mobility is not obtained unless the donor density is increased to at least ten times the original value. Consequently, the difference between the donor densities of the layers 42 and 43 is required to satisfy the condition that 42 is at least ten times the value of $\mu_{43}$.

In addition, the points to be considered for the configuration and design of the present invention will be next described.

(1) When growing the superlattice on the substrate crystal, the buffer layer (layer 82 of FIG. 1 to be described later) is first grown. However, this procedure depends on the crystal growth technology and the substrate crystal, and hence the buffer layer may be omitted in some cases.

(2) In the foregoing description, AlGaAs and GaAs are used as examples of the component materials of superlattice; however, other combinations of semiconductors such as a combination of InGaAsP and InP are also applicable. In an embodiment to be described later, an $Al_{0.3}Ga_{0.17}As$ layer is used as the barrier layer (layer 841 of FIG. 1); however, other Al composition values can also be applied to design the device according to a similar design concept.

(3) Although the unit structure (layer 40 of FIG. 5 and layer 840 of FIG. 1) of the superlattice structure in the foregoing description includes two kinds of quantum well layers, a plurality of the unit structure may be configured with a barrier layer sandwiched therebetween. In such a structure, a large amount of current can be applied, while providing a negative resistance.

(4) In the description about the quantum level in the quantum well structure with reference to FIG. 8, the penetration effect of the width of the quantum well layer 42 into the barrier of the electron wave has been ignored. Strictly speaking, however, it must be noted that the penetration takes place and hence the effective width of the quantum well layer 42 is a little broader.

(5) To increase the amplitude (peak-to-valley ratio) of the current in the negative resistance characteristic, it is effective to dispose at least two narrow quantum wells doped with Si atoms, the wells being used as electron destinations when the voltage is applied in the unit structure as described in (2) above.

(6) For the quantum levels established in the broad and narrow quantum wells, the excitation level (432 in FIG. 6) in the broad quantum well and the ground level (421 of FIG. 6) in the narrow quantum well are located in the vicinity of each other to cause a resonance effect, thereby widening the pipe for the electron transition process (tunneling). This enables a high-speed response and allows the device to achieve amplification and oscillation in the range of high frequency (up to 100 GHz).

BRIEF DESCRIPTION OF THE DRAWINGS

The present invention will be apparent from the following detailed description taken in conjunction with the following drawings in which.

DETAILED DESCRIPTION OF THE INVENTION

The present invention will be further described in detail with reference to the following embodiments. It should be appreciated that the present invention is not restricted by those embodiments.

Figure 1:
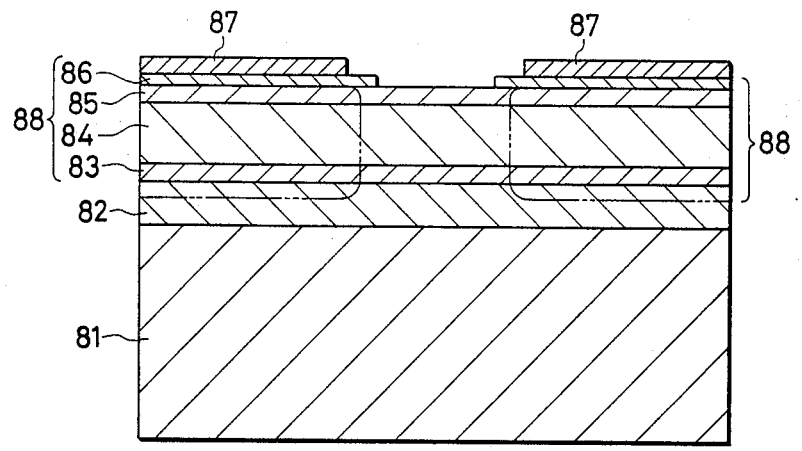
FIG. 1 is a cross-sectional diagram of a first embodiment of the semiconductor device according to the present invention.
Figure 2:
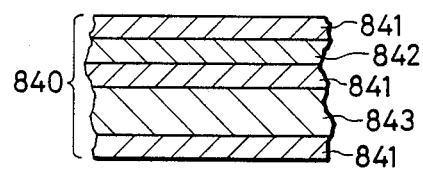
FIG. 2 is an enlarged cross-sectional diagram showing a superlattice structure portion of FIG. 1.

Embodiment 1: The first embodiment of the present invention will be described. FIG. 1 shows a cross section of the structure of a semiconductor device having the superlattice structure according to the present invention. This structure is manufactured by use of a molecular beam epitaxial (MBE) apparatus usually adapted to form such a superlattice structure. In the diagram, reference numeral 81 denotes a semi-insulated GaAs (surface orientation: 100) substrate. Layers 82–86 are epitaxially grown over the substrate 81 by use of the MBE technique. A layer 82 is an undoped n-type GaAs layer having a thickness of about 0.5 μm and serves as a buffer layer to decrease the effect from the substrate on the crystal layer to be grown. If the crystal growth is favorably developed, this layer 82 may be omitted. A layer 83 is an undoped $Al_{0.3}Ga_{0.7}As$ layer having a thickness of about 300 Å and is a barrier layer having a sufficient thickness to enclose a superlattice structure layer 84, which is a superlattice structure layer composed of a unit structure 840 as shown in FIG. 2. Basically, a single period of the unit structure is satisfactory. However, a plurality of periods (for example, ten periods of unit structures) may be disposed to increase the intensity of a signal to be externally obtained.

In a unit structure 840, an undoped $Al_{0.3}Ga_{0.7}As$ layer 841 has a thickness of 70 Å and forms a barrier layer. A GaAs layer 842 has a thickness of 70 Å and is doped with Si atoms (about $7 \times 10^{17} cm^{-3}$). An undoped GaAs layer 843 has a thickness of 150 Å.

In FIG. 1, undoped $Al_{0.3}Ga_{0.7}As$ layers 85 and 83 have a thickness of about 300 Å, and serve similar functions. An n-type GaAs layer 86 has a layer thickness of about 200 Å and is doped with Si atoms ($5 \times 10^{18} cm^{-3}$) to facilitate the formation of an ohmic electrode. An n-type ohmic electrode 87 (Au/Ge, Ni) is formed according to the vacuum evaporation method, and is thereafter heated to about 450° C. to form an alloy layer 88, thereby lowering the contact resistance. Layer 84 is disposed to allow an electric current to flow therethrough. Layer 84 is a layer in which the effect of the present invention is developed. To form a current path, a portion of the layer 86 is removed after the electrode is formed.

Figure 3:
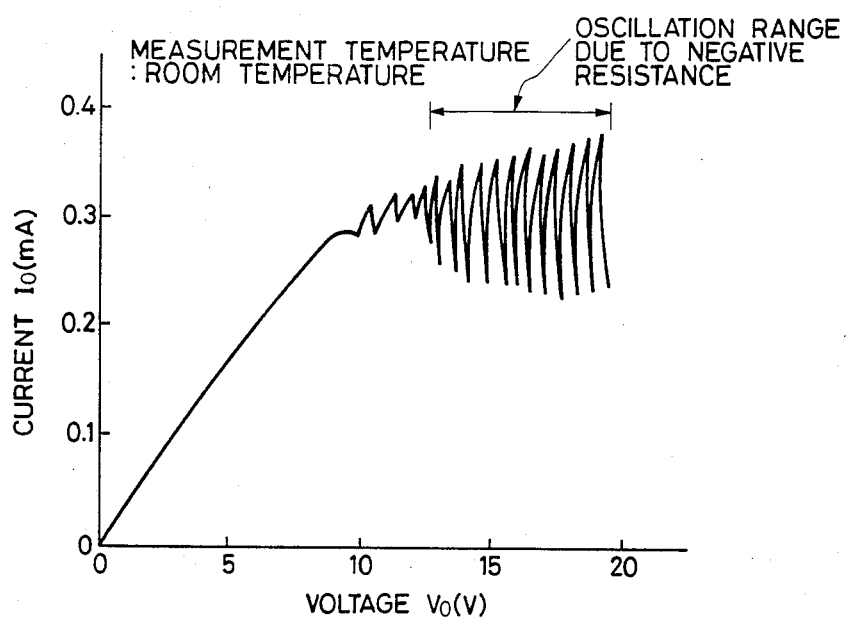
FIG. 3 is a graph demonstrating the current-voltage characteristic at the room temperature of the semiconductor device according to the present invention.
Figure 4:
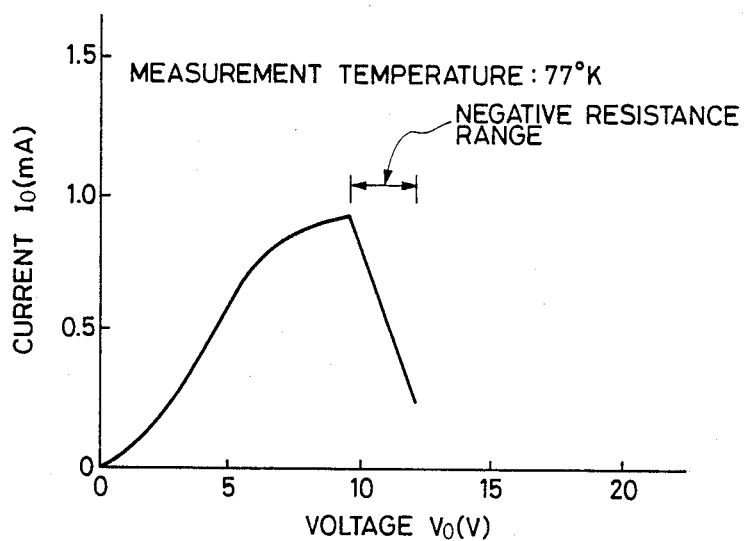
FIG. 4 is a graph demonstrating the current-voltage characteristic at 77° K. of the semiconductor device according to the present invention.
Figure 5:
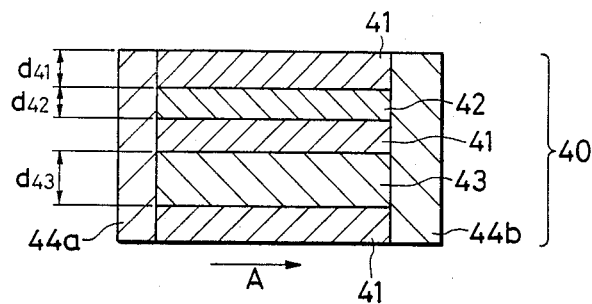
FIG. 5 is a cross-sectional diagram illustrating the device structure for explaining the principle of the semiconductor device according to the present invention in which an arrow A indicates the direction in which electrons are accelerated.
Figure 6:
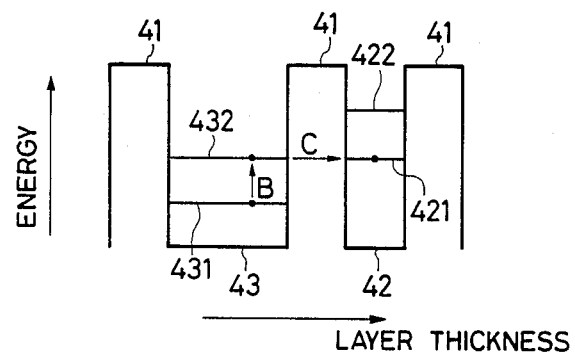
FIG. 6 is a band diagram of the conduction band of the device for explaining the principle of the semiconductor device according to the present invention in which an arrow B indicates the direction to which electrons are excited and an arrow C indicates the direction in which electrons move by virtue of the tunnel effect.
Figure 7:
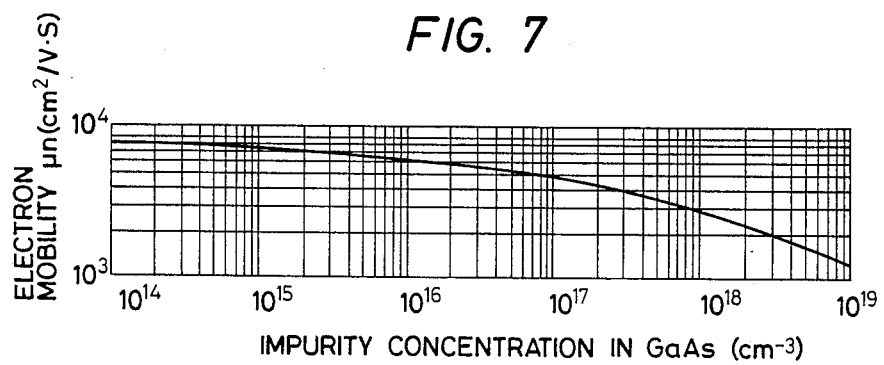
FIG. 7 is a graph demonstrating the relationships between the impurity concentration and the electron mobility in GaAs.
Figure 8:
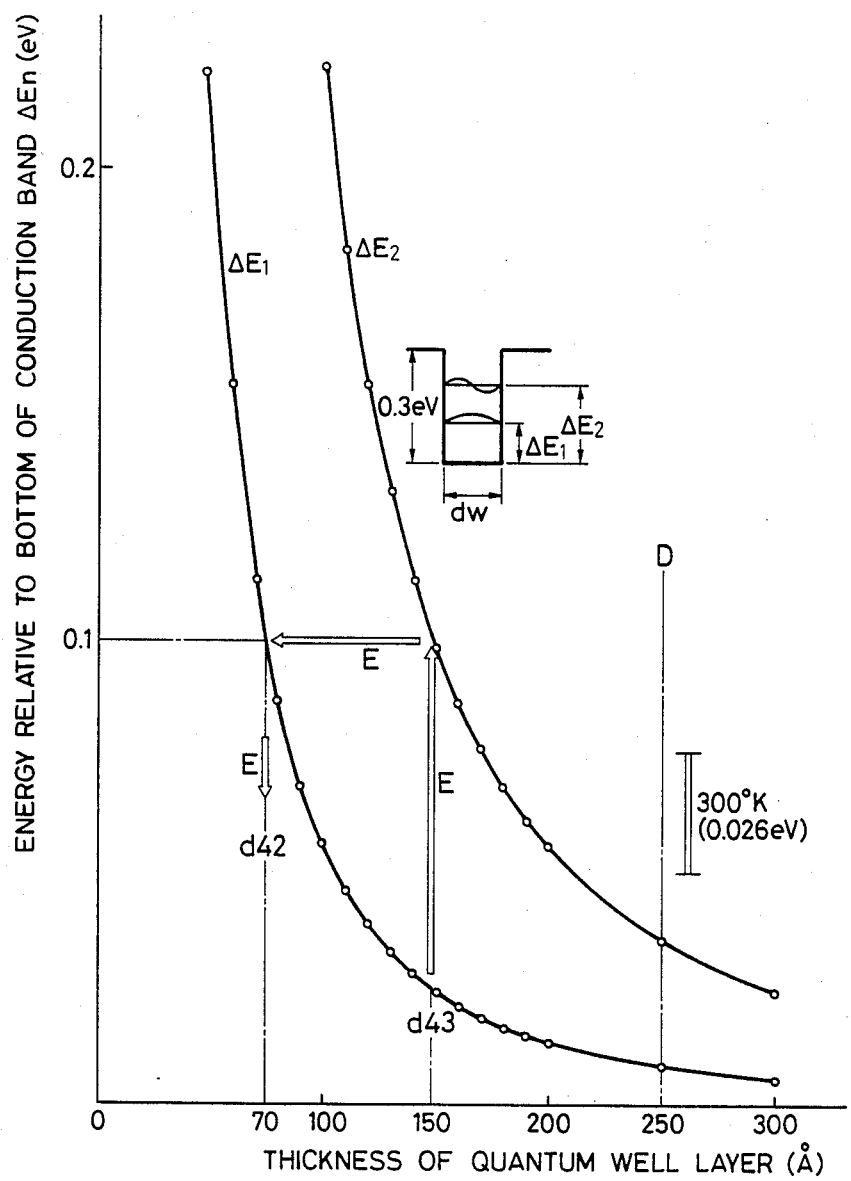
FIG. 8 is a graph depicting the relationships between the thickness of the GaAs quantum well layer and the quantum energy level in which D is a boundary line indicating a region in which the energy difference between the ground level and the first excitation level of electrons is at least equal to the thermal noise energy at the room temperature and an arrow E indicates the route for determining the thickness of the quantum well layer.
Figure 9:
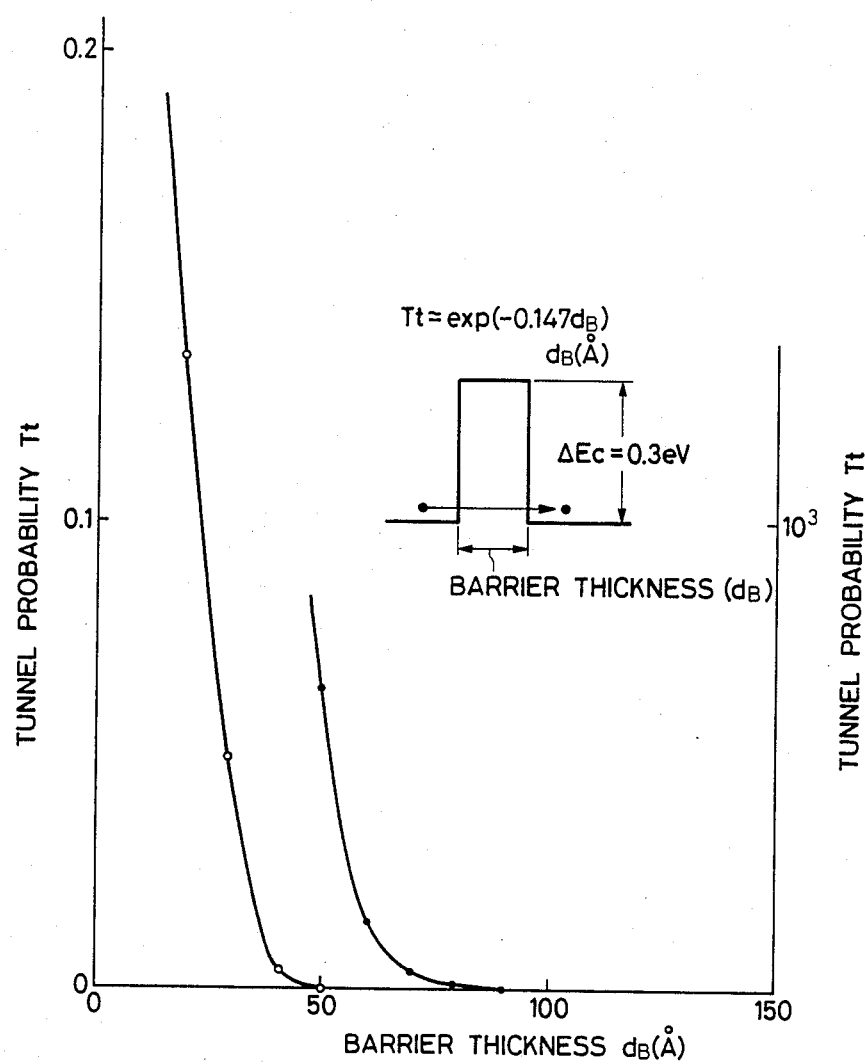
FIG. 9 is a graph showing the relationships between the thickness of the barrier layer and the tunnel probability.
Figure 10:
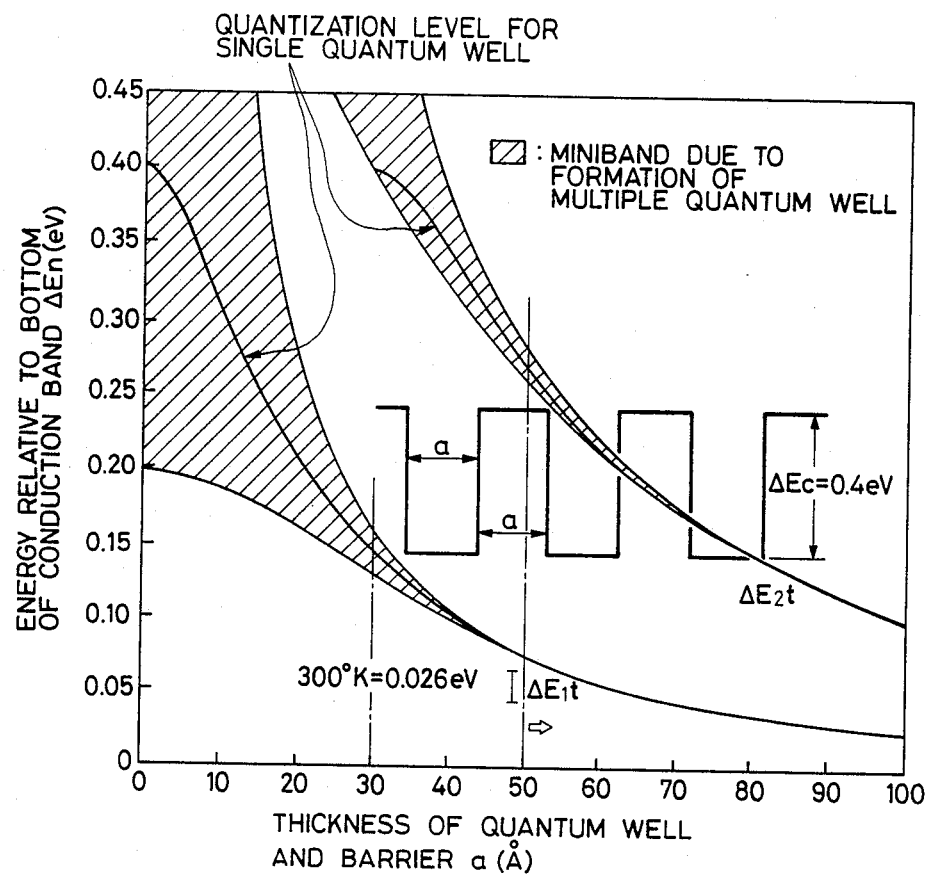
FIG. 10 is a graph illustrating a region in which a miniband is established when a plurality of quantum well structures are formed.
Figure 11:
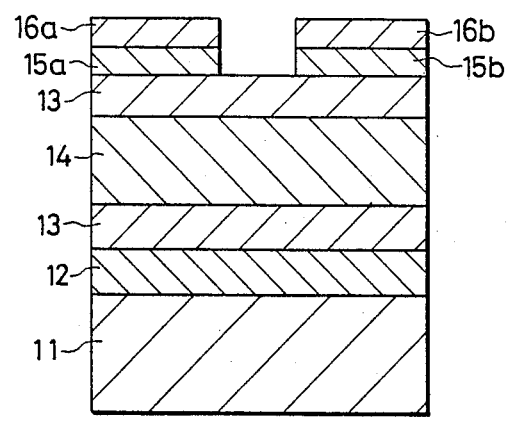
FIG. 11 is a cross-sectional diagram illustrating an example of the conventional negative resistance device.
Figure 12:
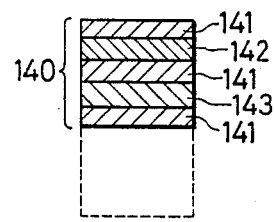
FIG. 12 ia an enlarged cross-sectional diagram showing the superlattice structure portion of FIG. 11.
Figure 13:
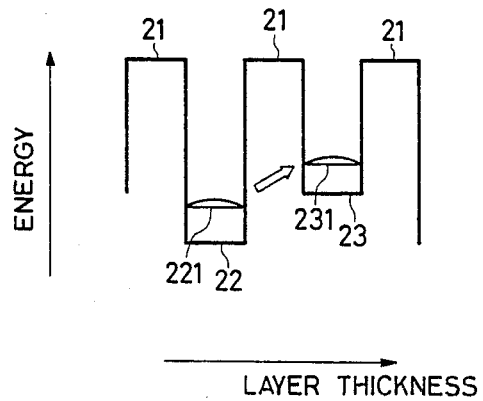
FIG. 13 is a band diagram illustrating the conduction band of a unit structure of the superlattice.
Figure 14:
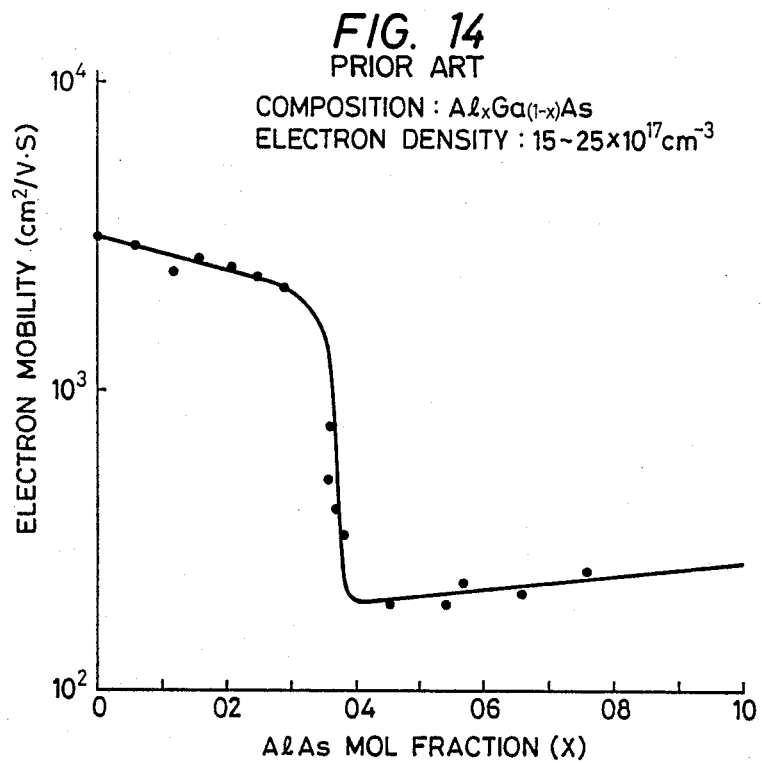
FIG. 14 is a graph demonstrating the relationships between the mol fraction of $Al_xGa_{(1-x)}As$ and the electron mobility.
Figure 15:
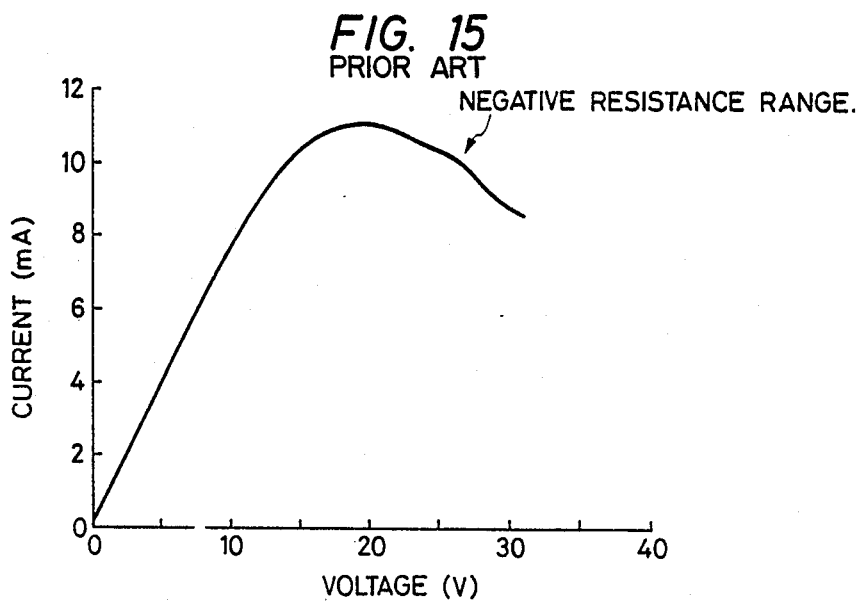
FIG. 15 is a graph showing the current-voltage characteristic of an example of the conventional negative resistance device.

Next, a voltage is applied across the electrodes 87, 87 and the voltage-current characteristics is measured by use of a curve tracer. FIGS. 3 and 4 are graphs showing the results of the measurement. The distance between the electrodes of the embodiment is about 2 mm.

Figure 16A:
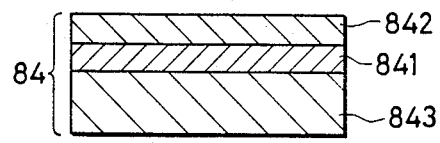
FIG. 16a is an enlarged cross-sectional view depicting the superlattice structure portion of a second embodiment of the semiconductor device according to the present invention.
Figure 16B:
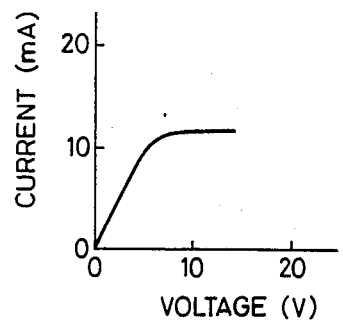
FIG. 16b is a graph demonstrating the current-voltage characteristic of the second embodiment of the semiconductor device according to the present invention.
Figure 17A:
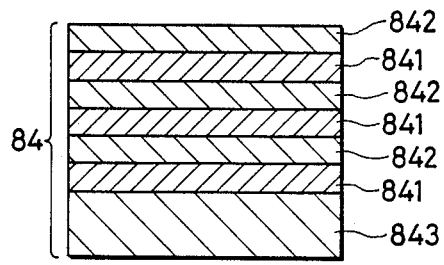
FIG. 17a is an enlarged cross-sectional view depicting the superlattice structure portion of a third embodiment of the semiconductor device according to the present invention.
Figure 17B:
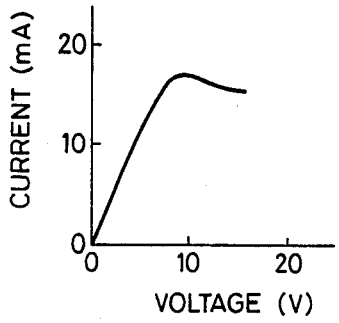
FIG. 17b is a graph demonstrating the current-voltage characteristic of the third embodiment of the semiconductor device according to the present invention.

According to the measurement results at room temperature shown in FIG. 3, the negative resistance appears beginning from an applied voltage of about 10V. At the applied voltage for which the negative resistance appears, it can be seen from the current variation pattern that a feedback from the measuring circuit system is effected and an oscillation phenomenon is caused. In the current-voltage characteristic at 77° K. shown in FIG. 4, the negative resistance appears beginning from 9V, and the current change is about 80%, which is greater than the current change developed at the room temperature. Embodiments 2 and 3: FIGS. 16a and 17a show cross-sectional structure diagrams of the superlattice portions of the embodiments 2 and 3, respectively of the semiconductor device according to the present invention. FIGS. 16b and 17b illustrate the current-voltage characteristics at room temperature of the embodiments 2 and 3, respectively.

These embodiments demonstrate the structures and effect in a case where a plurality of narrow quantum well layers doped with Si atoms are provided as the electron destinations in the layer structure according to the present invention. The basic cross-sectional structure is the same as the structure of the first embodiment of FIG. 1. The different point is only the superlattice structure layer 84, namely, two kinds of structures shown in FIGS. 16a and 17a. The superlattice structure layers of FIGS. 16a and 17a each comprise a period of the unit structure.

When the current-voltage characteristics of these embodiments are compared, the structure of FIG. 16a having only one narrow quantum well layer 842 develops a slight negative resistance as shown in FIG. 16b, whereas the structure of FIG. 17a having three narrow quantum well layers 842 develops a favorable negative registance characteristic as shown in FIG. 17b.

Figure 18:
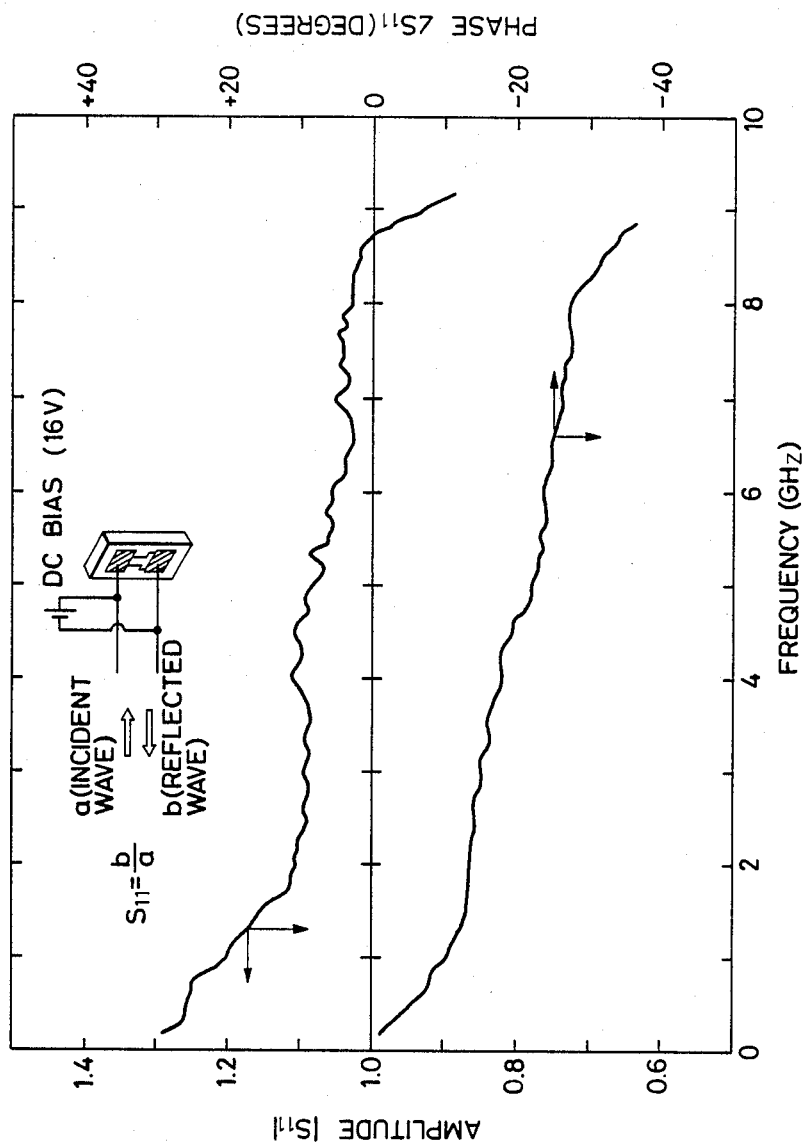
FIG. 18 is a graph showing the amplitude and phase of the reflection coefficient ($S_{11}$) or the frequency, and shows a high frequency amplifier for biasing the voltage region where the device develops the negative resistance.

Next, the experiment results confirming the effect of the semiconductor device of the present invention as a high-frequency amplifier are shown in FIG. 18. The cross-sectional structure of the semiconductor device used in this experiment is similar to the structure of the embodiments already described above. A direct-current voltage is applied across the ohmic electrodes of this device so as to bias the voltage region where the device develops the negative resistance. (Refer to the diagram inserted in FIG. 18 for details.) A microwave (0–10 GHz) is applied to the device and a ratio between the incident wave and the reflected wave has been measured. Dependence of the amplitude and phase of the thus obtained reflection coefficient ($S_{11}$) on the frequency is shown in FIG. 18. As can be seen from FIG. 18, in the frequency range where the amplitude $|S_{11}|$ is at least one, the reflected wave is greater than the incident wave. This indicates an amplifying operation. In the experiment example, the amplification is effected up to about 8.5 GHz and hence the device can be used as a amplifier in this frequency range. The frequency range is likely to shift toward the range of the higher frequency depending on the direct current bias condition. Namely, if the structure and bias of the semiconductor device of the present invention undergo optimization, the device has a capability to be applied to a frequency range up to about 100 GHz.

According to the semiconductor device of the present invention as described above, a superlattice structure is formed by alternatively superposing quantum well layers and barrier layers. Two quantum well layers sandwiching a barrier layer therebetween have different impurity concentration values and different layer thicknesses. A resistance developed in a case where a voltage is applied in a direction perpendicular to the direction of the thickness of the quantum well layers is a negative resistance. The base material of the semiconductor for the quantum well layer in the unit structure of the superlattice may be of a kind (for example, GaAs) according to the present invention. In addition, since the control of the aluminum composition need only be performed for the barrier layer like in the conventional products, the difficulty of control is reduced almost by 50%. Moreover, the layer thicknesses of two kinds of quantum well layers are required to be controlled. However, the control can be easily achieved with a high precision by use of the molecular beam epitaxial growth technique ordinarily utilized, and hence the production if facilitated.

Consequently, the design for semiconductor devices becomes easy and the reproducibility and reliability of the production are improved. In addition, the present invention allows a great difference between the electron mobilities of the two kinds of electron well layers having the different electron mobilities without considerably lowering the quality of the crystal. This is because the $Al_xGa_{(1-x)}As$ layer need not be used as the quantum well layer. Moreover, at a low temperature such as 77° K., the electron mobility is determined by the impurity scattering. Consequently, the electron mobility of the semiconductor device according to the present invention is extraordinarily greater than the electron mobility of the prior art product.

Furthermore, when the number of narrow quantum well layers as the electron destination is increased, the peak-to-valley ratio of the negative resistance in the current-voltage characteristic is also increased.

In addition, it has been known that satisfactory negative resistance cannot be easily developed in the design which does not take into consideration the resonance effect between the quantum levels formed in the wide and narrow quantum wells. This implies the essential importance of the device design including the consideration of the quantum levels as described in conjunction with the design of the superlattice structure of the semiconductor device according to the present invention.

What is claimed is:

1. A negative resistance semiconductor device having a superlattice structure comprising:

at least one unit structure comprised of first, second and third semiconductor layers;

said first and third semiconductor layers being quantum well layers having an impurity concentration, and said second semiconductor layer being a barrier layer, said first, second and third semiconductor layers being superposed on each other so that the second semiconductor layer is between the first and third semiconductor layers;

said impurity concentration of said first semiconductor layer being higher than said impurity concentration of said third semiconductor layer, and said first semiconductor having a quantum energy level determined by a layer thickness thereof;

said third semiconductor layer being of a thickness having first and second quantum energy levels, said first quantum energy level being lower than said quantum energy level of said first semiconductor layer and said second quantum energy level being equal to or higher than said quantum energy level of said first semiconductor layer;

said second semiconductor layer being of a thickness which allows electrons existing at said second quantum energy level of said third semiconductor layer to transfer easily from said second quantum energy level of said third semiconductor layer to said quantum energy level of said first semiconductor layer; and at least one pair of electrodes for applying voltage to said superlattice structure in a direction perpendicular to the direction of thickness of said superlattice so as to allow electrons at each of said quantum energy level to flow through said quantum well layers;

whereby an increase in voltage applied to said superlattice structure causes electrons at said first quantum energy level of said third semiconductor layer to transfer to said quantum energy level of said first semiconductor layer through said second quantum energy level of said third semiconductor layer to reduce the mobility of electrons in said first semiconductor layer due to the higher impurity concentration of said first semiconductor layer.

2. A semiconductor device according to claim 1, wherein said at least one unit structure further comprises at least one set of fourth and fifth semiconductor layers, said fourth semiconductor layer being identical in composition to said second semiconductor layer and said fifth semiconductor layer being identical in composition to said first semiconductor layer;

said fourth and fifth semiconductor layers being arranged such that said fourth semiconductor layer is in contact with said first and said fifth semiconductor layers.

3. A semiconductor device according to claim 1, wherein said at least one unit structure further comprises first and second outer layers, said first outer layer contacting said first semiconductor layer and a second outer layer contacting said third semiconductor layer.

4. A semiconductor device according to claim 1, wherein each of said quantum well layers is comprised of GaAs and said barrier layer is comprised of $Al_xGa_{(1-x)}As$.

5. A semiconductor device according to claim 1, wherein said impurity concentration of said first semiconductor layer is at least ten times that of said third semiconductor layer.

6. A semiconductor device according to claim 1, wherein the thickness of said barrier layer is not less than 30 Å and not more than 100 Å and the thickness of each of said quantum well layers is not less than 30 Å and not more than 250 Å.

7. A semiconductor device according to claim 3, further comprising:

(a) a semi-insulated GaAs substrate;

(b) an undoped n-type GaAs layer superposed on said semi-insulated GaAs substrate;

(c) an undoped $Al_{0.3}Ga_{0.7}As$ layer superposed on said n-type GaAs layer;

(d) said at least one unit structure being superposed on said undoped $Al_{0.3}Ga_{0.7}As$ layer;

(e) an undoped n-type $Al_{0.3}Ga_{0.7}As$ layer or a doped n-type $Al_{0.3}Ga_{0.7}As$ layer with a low impurity concentration superposed on said at least one unit structure;

(f) at least one n-type GaAs layer doped with a high impurity concentration superposed on said undoped n-type $Al_{0.3}Ga_{0.7}As$ layer;

(g) at least two n-type ohmic electrodes comprised of a metal superposed on said at least one n-type GaAs layer doped with a high impurity concentration;

wherein said first outer layer, said second semiconductor layer, and said second outer layer of said at least one unit structure are selected from the group consisting of undoped n-type $Al_{0.3}Ga_{0.7}As$ and doped n-type $Al_{0.3}Ga_{0.7}As$ having a low impurity concentration; and said first semiconductor layer and said third semiconductor layer are doped n-type GaAs with a high impurity concentration.

* * * * *